US012771026B2

(12) United States Patent
Lin

(10) Patent No.: US 12,771,026 B2
(45) Date of Patent: Oct. 20, 2026

(54) LIQUID CRYSTAL PHASE SHIFTER AND ANTENNA DEVICE

(71) Applicant: AUO Corporation, Hsin-Chu (TW)

(72) Inventor: Cheng-Te Lin, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 349 days.

(21) Appl. No.: 18/393,758

(22) Filed: Dec. 22, 2023

(65) Prior Publication Data

US 2024/0396211 A1 Nov. 28, 2024

(30) Foreign Application Priority Data

May 25, 2023 (TW) ................................ 112119571

(51) Int. Cl.
*H01Q 3/36* (2006.01)
*H01P 3/08* (2006.01)
*H03H 11/16* (2006.01)

(52) U.S. Cl.
CPC ............... *H01Q 3/36* (2013.01); *H01P 3/081* (2013.01); *H03H 11/16* (2013.01)

(58) Field of Classification Search
CPC ........... H01P 1/181; H01P 3/081; H01Q 3/36; H03H 11/16
See application file for complete search history.

(56) References Cited

U.S. PATENT DOCUMENTS

| | | | | |
|---|---|---|---|---|
| 11,682,835 | B2 * | 6/2023 | Kuo | H01Q 3/36 343/893 |
| 2003/0175411 | A1 * | 9/2003 | Kodas | H10P 14/668 257/E21.174 |
| 2013/0157729 | A1 * | 6/2013 | Tabe | H04W 52/0245 977/932 |
| 2014/0071432 | A1 * | 3/2014 | Dunne | G01S 7/497 356/5.01 |
| 2015/0307026 | A1 * | 10/2015 | Minikey, Jr. | B60R 11/04 348/148 |
| 2017/0187086 | A1 * | 6/2017 | Koul | H01H 59/0009 |
| 2018/0085593 | A1 * | 3/2018 | Fayram | A61N 1/36062 |
| 2019/0140363 | A1 | 5/2019 | Otsubo et al. | |
| 2019/0305402 | A1 * | 10/2019 | Dalmia | H01Q 1/2283 |
| 2021/0005979 | A1 * | 1/2021 | Chiu | H01Q 1/38 |

(Continued)

FOREIGN PATENT DOCUMENTS

| | | | |
|---|---|---|---|
| CN | 113839189 | A | 12/2021 |
| CN | 114883794 | A | 8/2022 |
| TW | I730700 | B | 6/2021 |

*Primary Examiner* — Thien M Le
(74) *Attorney, Agent, or Firm* — WPAT, PC

(57) ABSTRACT

A liquid crystal phase shifter includes a first transistor, a storage capacitor, a phase steering electrode and a common electrode. A first end of the first transistor is electrically connected to a source line, and a control end of the first transistor is configured to receive a first control signal. A first end of the storage capacitor is electrically connected to a second end of the first transistor, and a second end of the storage capacitor is electrically connected to an auxiliary source line. The phase shifting electrode is electrically connected to the second end of the first transistor. The common electrode and the phase shifting electrode form a liquid crystal capacitor, and the common electrode is configured to receive a ground voltage.

20 Claims, 14 Drawing Sheets

(56) References Cited

U.S. PATENT DOCUMENTS

| | | | | |
|---|---|---|---|---|
| 2021/0135327 | A1* | 5/2021 | Wang | H01Q 1/22 |
| 2021/0234268 | A1 | 7/2021 | Liu et al. | |
| 2022/0271426 | A1 | 8/2022 | Kuo et al. | |
| 2023/0311422 | A1* | 10/2023 | Jones | B33Y 50/02 264/40.1 |

* cited by examiner

LIQUID CRYSTAL PHASE SHIFTER AND ANTENNA DEVICE

RELATED APPLICATIONS

This application claims priority to Taiwan Application Serial Number 112119571, filed May 25, 2023, which is herein incorporated by reference.

BACKGROUND

Field of Invention

The disclosure relates to a liquid crystal phase shifter and antenna device. More particularly, the disclosure relates to liquid crystal phase shifter and antenna device associated with liquid crystal based antenna.

Description of Related Art

Nowadays, antennas can be used in many fields, such as, advanced driver assistance system radars, beyond visual line of sight operations for drones, remote monitoring operations of vital signs, emotion recognition, radio transmission, 5G communication, etc. As the array antennas become widely used, how to improve the accuracy of the antennas and to reduce the cost is an important issue in this field.

SUMMARY

In order to solve the foregoing problems, one aspect of the present disclosure is related to a liquid crystal phase shifter which includes a first transistor, a storage capacitor, a phase shifting electrode and a common electrode. A first end of the storage capacitor is electrically connected to a second end of the first transistor, and a second end of the storage capacitor is electrically connected to an auxiliary source line. The phase shifting electrode is electrically connected to the second end of the first transistor. The common electrode is configured to receive a ground voltage. The common electrode and the phase shifting electrode form a liquid crystal capacitor. The liquid crystal phase shifter is attached to a feeding plate, and the common electrode of the liquid crystal phase shifter and a microstrip feed line of the feeding plate form a microstrip antenna.

Another aspect of the present disclosure is related to a liquid crystal phase shifter which includes a phased array. The phased array includes a plurality of first phase shifting circuits, a first source line, a first auxiliary source line and a common electrode. The first phase shifting circuits are arranged in a plurality of rows of a matrix. The first phase shifting circuits comprise a plurality of first transistors, a plurality of first storage capacitors and a plurality of phase shifting electrodes electrically connected to first ends of the first storage capacitors. The first source line is electrically connected to first ends of the first transistors. Second ends of the first transistors are electrically connected to the first ends of the first storage capacitors, respectively. The first auxiliary source line is electrically connected to second ends of the first storage capacitors. The common electrode and the first phase shifting electrodes form a plurality of first liquid crystal capacitors. The common electrode is configured to receive a ground voltage.

Another aspect of the present disclosure is related to an antenna device which includes a feeding plate and a liquid crystal phase shifter. The feeding plate includes a circuit board, a microstrip feed line and a ground layer. The ground layer and the microstrip feed line are disposed in the opposite surfaces of the circuit board. The liquid crystal phase shifter is attached to the feeding plate. The liquid crystal phase shifter overlaps a portion of the microstrip feed line. The liquid crystal phase shifter includes a first substrate, a phased array formed on the first substrate, a liquid crystal layer, a second substrate and a common electrode formed on the second substrate. The liquid crystal layer is disposed between the phased array and the common electrode. The common electrode is electrically connected to the ground layer. The common electrode of the liquid crystal phase shifter and the microstrip feed line of the feeding plate form a microstrip antenna.

Summary, the present disclosure provides a liquid crystal phase shifter including the common electrode configured to receive the ground voltage, in order to use the common electrode as a ground plane of the microstrip antenna, thereby reducing the cost and increasing the accuracy.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. In the drawings.

DETAILED DESCRIPTION

Figure 1A:
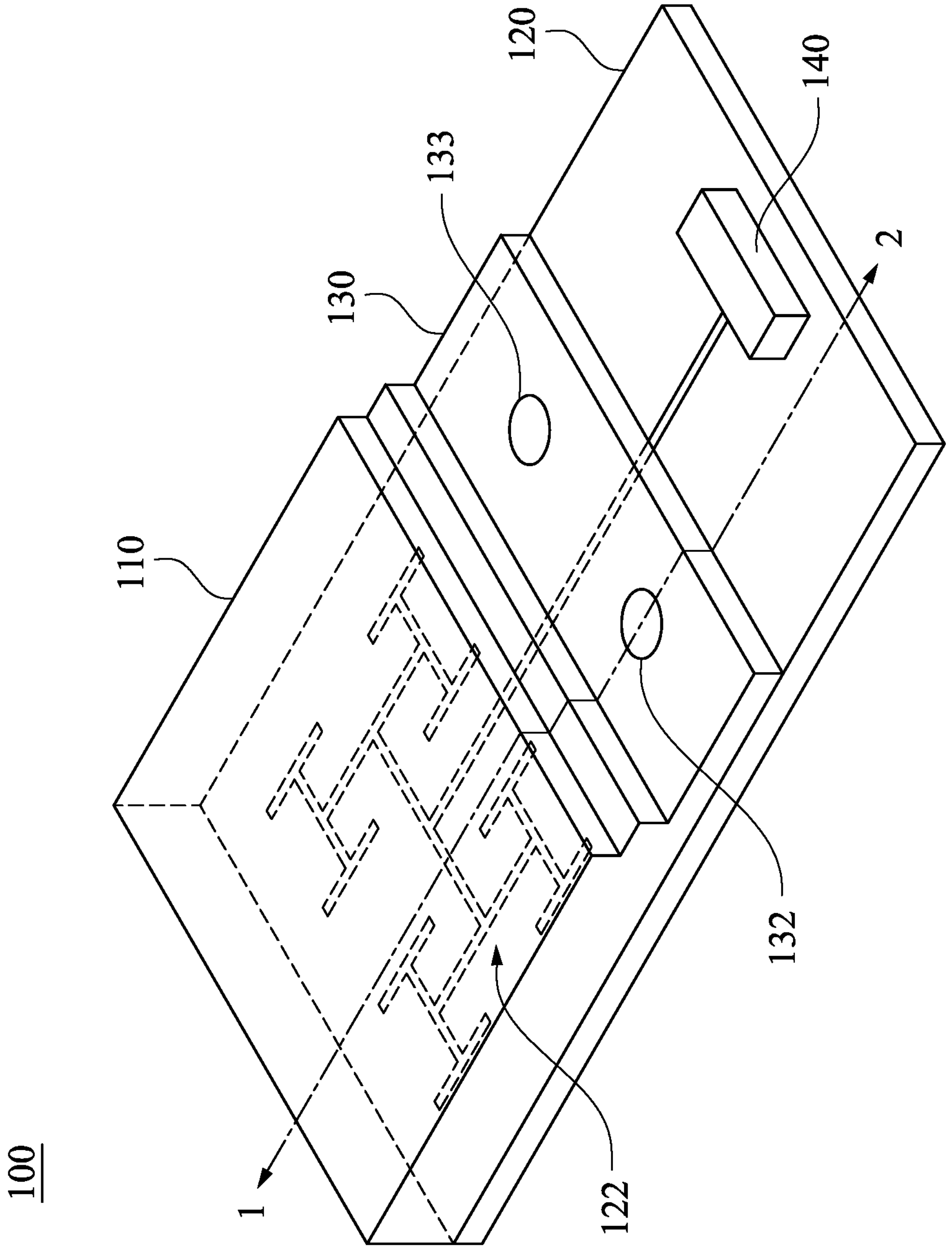
FIG. 1A depicts a schematic diagram of an antenna device according to some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. Description of the operation does not intend to limit the operation sequence. Any structures resulting from recombination of elements with equivalent effects are within the scope of the present disclosure. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

In the description herein and throughout the claims that follow, unless otherwise defined, all terms have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In the description herein and throughout the claims that follow, the terms "comprise" or "comprising," "include" or "including," "have" or "having," "contain" or "containing" and the like used herein are to be understood to be open-ended, i.e., to mean including but not limited to.

A description is provided with reference to FIG. 1A. FIG. 1A depicts a schematic diagram of an antenna device 100 according to some embodiments of the present disclosure. As shown in FIG. 1A, the antenna device 100 includes a liquid crystal phase shifter 110, a feeding plate 120, a cover plate 130, connection elements 132 and 133 and a signal generator 140.

In some embodiments, the feeding plate 120 can be implemented by a circuit printed board. In some embodiments, the feeding plate 120 includes a microstrip feed line 122 which can be implemented by printed circuit. In some embodiments, the microstrip feed line 122 is a conductive material, and the microstrip feed line 122 is configured to transmit the signal supplied from the signal generator 140. In some embodiments, the antenna device 100 can be considered as a microstrip antenna.

In some embodiments, the signal generator 140 can be implemented by a monolithic microwave integrated circuit. In some embodiments, the signal generator 140 is electrically connected to the microstrip feed line 122 to feed the high frequency signal to the microstrip feed line 122, in which the said high frequency signal can be radio frequency signal or microwave signal. In some embodiments, the projection of the microstrip feed line 122 on a horizontal plane extends from the signal generator 140 to the liquid crystal phase shifter 110.

In some embodiments, the liquid crystal phase shifter 110 overlaps a partial of the microstrip feed line 122. As such, the liquid crystal phase shifter 110 changes the dielectric constant based on the liquid crystal control techniques, so as to adjust the resonant frequency of the microstrip antenna, thereby steering the field pattern and the beam direction of the high frequency signal. In some embodiments, since the large-area element arrays are low-cost to produce, and the process accuracy thereof is better than the traditional array antennas produced by the printed circuit board fabrication process, the liquid crystal phase shifter 110 produced by the panel manufacturing process can achieve the higher accuracy and lower cost.

In some embodiments, the cover plate 130 overlaps a partial feeding line of the microstrip feed line 122. In some embodiments, the cover plate 130 is adjacent to the liquid crystal phase shifter 110, and the cover plate 130 is fixed on the feeding plate 120 by the connection elements 132 and 133 which are conductive materials. In some embodiments, the connection elements 132 and 133 are components for through holes soldering or screws. In other embodiments, the connection elements 132 and 133 can be implemented by the other conductive components, which are not intended to limit the present disclosure.

Figure 1B:
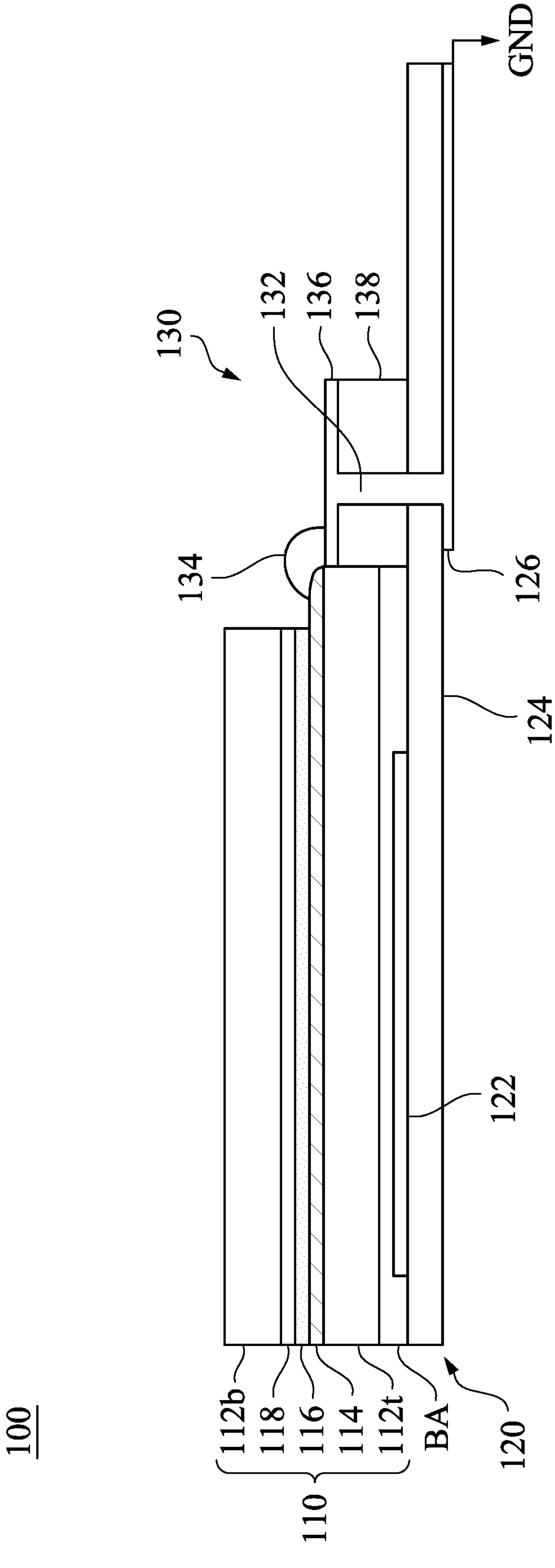
FIG. 1B depicts a cross section of the antenna device along a dash-dot line 1-2 in FIG. 1A according to some embodiments of the present disclosure.

A description is provided with reference to FIG. 1A and FIG. 1B. FIG. 1B depicts a cross section of the antenna device 100 along a dash-dot line 1-2 in FIG. 1A according to some embodiments of the present disclosure. As shown in FIG. 1B, the antenna device 100 further includes bonding adhesive BA configured to fix the liquid crystal phase shifter 110 to the feeding plate 120. In some embodiments, the feeding plate 120 includes a microstrip feed line 122, a circuit board 124 and a ground layer 126. In some embodiments, the ground layer 126 and the microstrip feed line 122 are formed on the opposite surfaces of the circuit board 124, and the projection of the ground layer 126 of the feeding plate 120 on a horizontal plane does not overlap the liquid crystal phase shifter 110.

In some embodiments, the liquid crystal phase shifter 110 includes substrates 112*t* and 112*b*, a phased array 118, a liquid crystal layer 116 and a common electrode 114. In some embodiments, the phased array 118 is formed on the substrate 112*t*. In some embodiments, the substrates 112*t* and 112*b* can be implemented by glass substrates, and the material properties of glass substrates have low loss characteristics. In some embodiments, the liquid crystal layer 116 is disposed between the phased array 118 and the common electrode 114, and the alignment of the liquid crystal in the liquid crystal layer 116 depends on the voltages controlled by the phased array 118, thereby steering the direction of the beam according to the different dielectric constants of different alignments of liquid crystals.

In some embodiments, the cover plate 130 includes a circuit board 138 and a conductive layer 136 disposed in the circuit board 138, and the conductive layer 136 is adjacent to the common electrode 114. In some embodiments, the common electrode 114 of the liquid crystal phase shifter 110 is electrically connected to the conductive layer 136 of the cover plate 130 through the conductive part 134. In some embodiments, the conductive part 134 is soldering component. In some embodiments, the conductive part 134 is conductive material. As such, the common electrode 114 of the liquid crystal phase shifter 110 is electrically connected through the conductive part 134, the conductive layer 136 of the cover plate 130 and the connection element 132 to the ground layer 126 of the feeding plate 120, so that the common electrode 114 of the liquid crystal phase shifter 110 is grounded. That is, the common electrode 114 of the liquid crystal phase shifter 110 can be maintained at the ground voltage GND (such as, 0 volts) through an electrical path between the conductive part 134, the conductive layer 136 of the cover plate 130 and the connection element 132. In the other embodiments, the common electrode 114 of the liquid crystal phase shifter 110 can be grounded and maintained at the ground voltage GND (such as, 0 volts) by the other connection manner; the present disclosure is not limited thereto.

In some embodiments, the common electrode 114 of the liquid crystal phase shifter 110 is also used as a ground plane of a microstrip antenna, so that the common electrode 114 of the liquid crystal phase shifter 110 and the microstrip feed line 122 can form the microstrip antenna. As such, functions of the ground plane of the microstrip antenna are integrated with the common electrode 114 of the liquid crystal phase shifter 110, in order to reduce the volume and manufacturing process of the antenna device 100.

Figure 2:
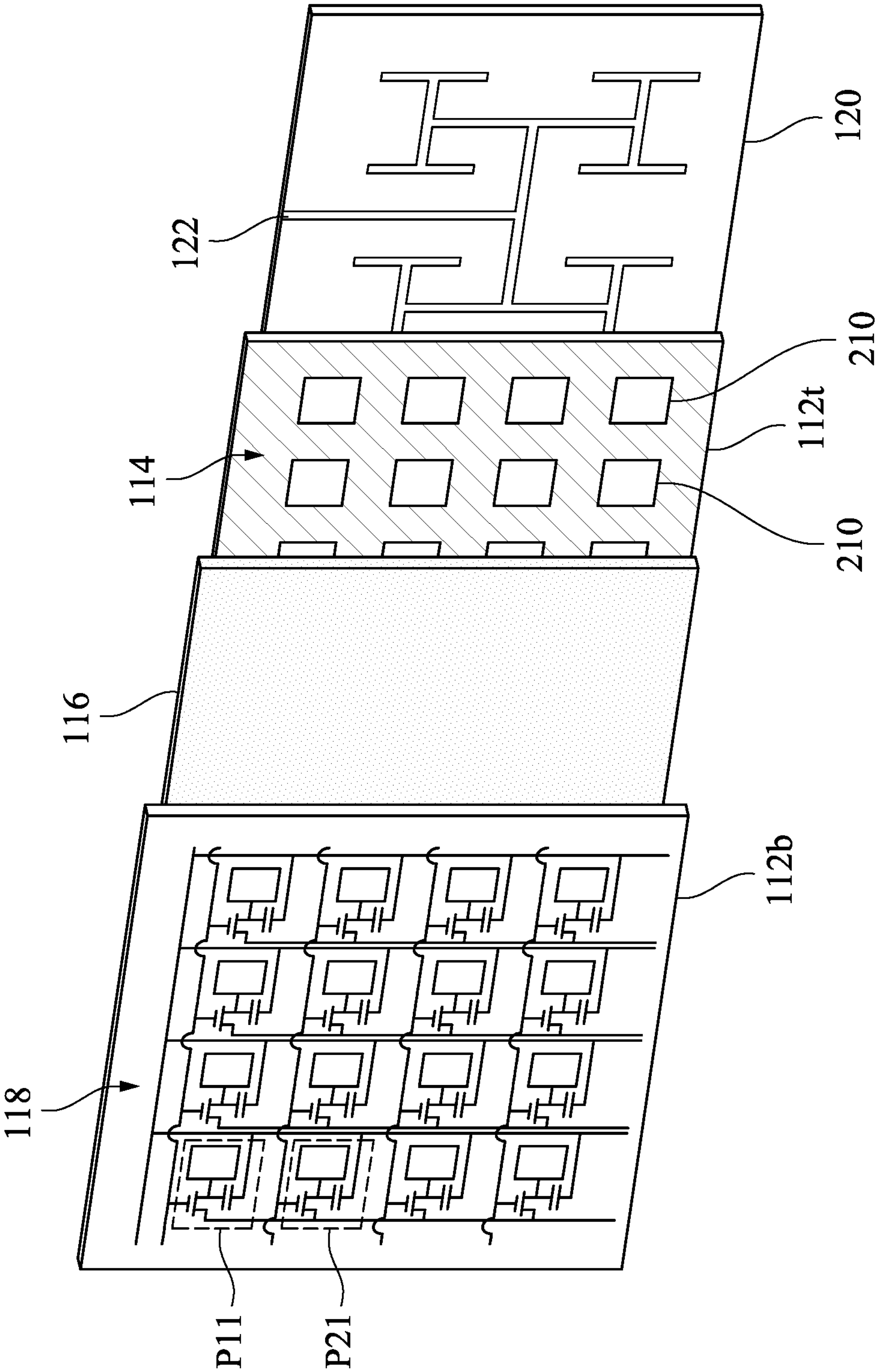
FIG. 2 depicts a schematic diagram of substrates, a liquid crystal layer and a feeding plate according to some embodiments of the present disclosure.

A description is provided with reference to FIG. 1B and FIG. 2. FIG. 2 depicts a schematic diagram of substrates 112*b* and 112*t*, a liquid crystal layer 116 and a feeding plate 120 according to some embodiments of the present disclosure. To be noted that, the front and back surfaces of the substrate 112*b* in FIG. 2 are reversed for better illustrating the phased array 118 which is formed on the substrate 112*b*. Specifically, in the liquid crystal phase shifter 110, the phased array 118 formed on the substrate 112*b* faces to the liquid crystal layer 116, and the common electrode 114 formed on the substrate 112*t* faces to the liquid crystal layer 116.

As shown in FIG. 2, the phased array 118 is formed on the substrate 112*b*, and the phased array 118 includes phase shifting circuits P11 and P12. Each of the phase shifting circuits P11~P12 includes a transistor, a storage capacitor and a phase shifting electrode. The elements and connection relationship thereof in the phase shifting circuit are described in detailed in the following embodiments.

In some embodiments, the common electrode 114 is formed on the substrate 112*t*. In some embodiments, the common electrode 114 includes multiple slots 210 (such as, the rectangular slots), and a projection of a center of each of the slots 210 on the horizontal plane corresponding to an end of the microstrip feed line 122. In some embodiments, length of each edges of the slots 210 of the common electrode 114 is proportional to wavelength of the high frequency wave, in order to form a microstrip slot antenna by the common electrode 114 and the microstrip feed line 122.

Figure 3:
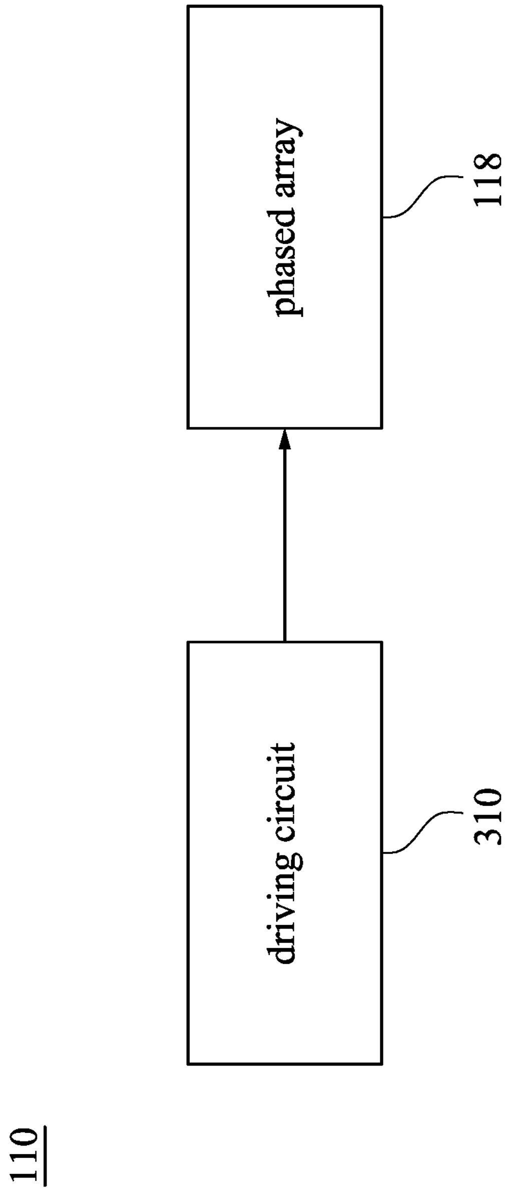
FIG. 3 depicts a function block of a liquid crystal phase shifter according to some embodiments of the present disclosure.

A description is provided with reference to FIG. 3. FIG. 3 depicts a function block of a liquid crystal phase shifter 110 according to some embodiments of the present disclosure. As shown in FIG. 3, the liquid crystal phase shifter 110 includes a driving circuit 310 and a phased array 118. The driving circuit 310 is electrically connected to the phased array 118, and the driving circuit 310 is configured to drive the phased array 118. The common electrode 114 is used as a ground plane of the microstrip antenna by maintaining the common electrode 114 at the ground voltage GND.

Since the common electrode 114 is used as a ground plane of the microstrip antenna, the polarity reversal driving which is to avoid deformation inertia of the liquid crystal cannot be performed on the common electrode 114 of the liquid crystal phase shifter 110. In addition, the output of the source driver is mostly in a positive voltage range. As such, the following embodiments are described how to provide the positive half cycle and negative half cycle operations while the common electrode 114 is grounded.

Figure 4:
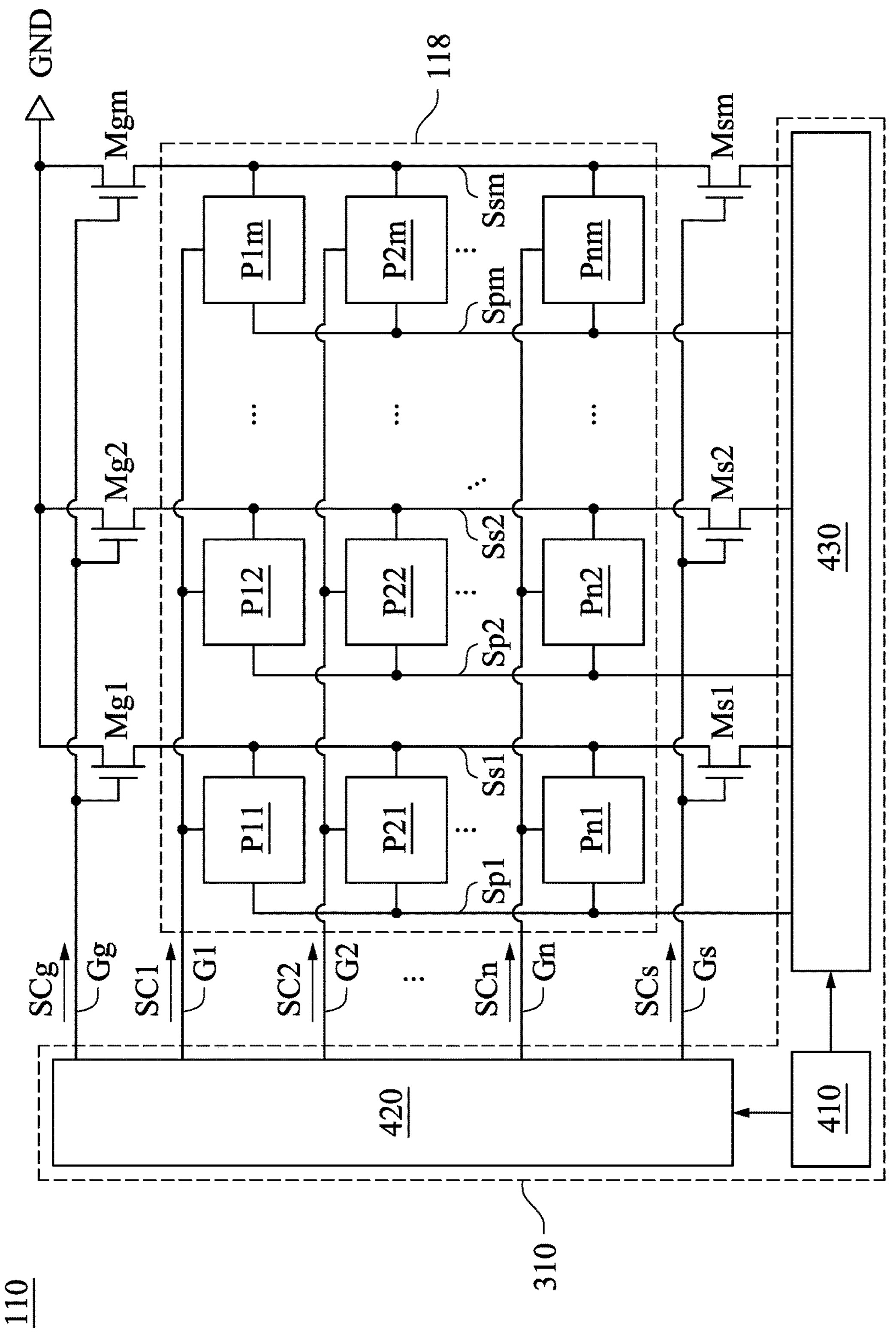
FIG. 4 depicts a schematic diagram of a liquid crystal phase shifter according to some embodiments of the present disclosure.

A description is provided with reference to FIG. 4. FIG. 4 depicts a schematic diagram of a liquid crystal phase shifter 110 according to some embodiments of the present disclosure. As shown in FIG. 4, the liquid crystal phase shifter 110 includes a driving circuit 310, a phased array 118, transistors Mg1~Mgm, transistors Ms1~Msm and conductive lines Gg and Gs. The driving circuit 310 includes a timing controller 410, a gate driving circuit 420 and a source driving circuit 430. In some embodiments, the gate driving circuit 420 and the source driving circuit 430 are controlled by the timing controller 410. In some embodiments, the gate driving circuit 420 can be implemented by the gate driver integrated circuit. In the other embodiments, the gate driving circuit 420 can be implemented by the gate on array techniques. In some embodiments, the source driving circuit 430 can be implemented by the source driver integrated circuit.

In some embodiments, the phased array 118 includes phase shifting circuits P11~P1*m*, P21~P2*m* to Pn1~Pnm, gate lines G1~Gn, source lines Sp1~Spm and auxiliary source lines Ss1~Ssm, in which "n" and "m" are integers greater than or equal to 1.

In some embodiments, the phase shifting circuits P11~Pnm arranged in which rows of the phased array 118 depends on the gate lines G1~Gn. For example, the phase shifting circuits P11~P1*m* arranged in a first row are electrically connected to the gate driving circuit 420 through the gate line G1. The phase shifting circuits P21~P2*m* arranged in a second row are electrically connected to the gate driving circuit 420 through the gate line G2, and so on. The phase shifting circuits Pn1~Pnm arranged in an n-th row are electrically connected to the gate driving circuit 420 through the gate line Gn. As such, the gate driving circuit 420 respectively transmit control signals SC1~SCn through the gate lines G1~Gn to the phase shifting circuits P11~Pnm.

In some embodiments, the phase shifting circuit P11~Pnm arranged in which columns of the phased array 118 depends on the source lines Sp1~Spm. For example, phase shifting circuits P11~Pn1 arranged in a first column are electrically connected to the source driving circuit 430 through the source line Sp1. The phase shifting circuits P12~Pn2 arranged in a second column are electrically connected to the source driving circuit 430 through the source line Sp2, and so on. The phase shifting circuits P1*m*~Pnm arranged in the m-th column are electrically connected to the source driving circuit 430 through the source line Spm. As such, the voltages supplied from the source driving circuit 430 are respectively provide through the source lines Sp1~Spm to the phase shifting circuits P11~Pnm.

In some embodiments, first ends of the transistor Mg1~Mgm is grounded. Second ends of the transistors Mg1~Mgm are electrically connected to the auxiliary source lines Ss1~Ssm, respectively. Control ends of the transistors Mg1~Mgm are electrically connected to the gate driving circuit 420 through the conductive line Gg, so as receive the control signal SCg supplied from the gate driving circuit 420.

In some embodiments, the auxiliary source lines Ss1~Ssm are electrically connected to the corresponding phase shifting circuits P11~Pnm. Specifically, the auxiliary source line Ss1 is electrically connected to the phase shifting circuits P11~Pn1. The auxiliary source line Ss2 is electrically connected to the phase shifting circuits P12~Pn2, and so on. The auxiliary source line Ssm is electrically connected to the phase shifting circuits P1*m*~Pnm.

In some embodiments, first ends of the transistors Ms1~Msm are electrically connected to the auxiliary source lines Ss1~Ssm. Second ends of the transistors Ms1~Msm are electrically connected to the source driving circuit 430. Control ends of the transistors Ms1~Msm are electrically connected to the gate driving circuit 420 through the conductive line Gs to receive the control signal SCs supplied from the gate driving circuit 420.

Figure 5:
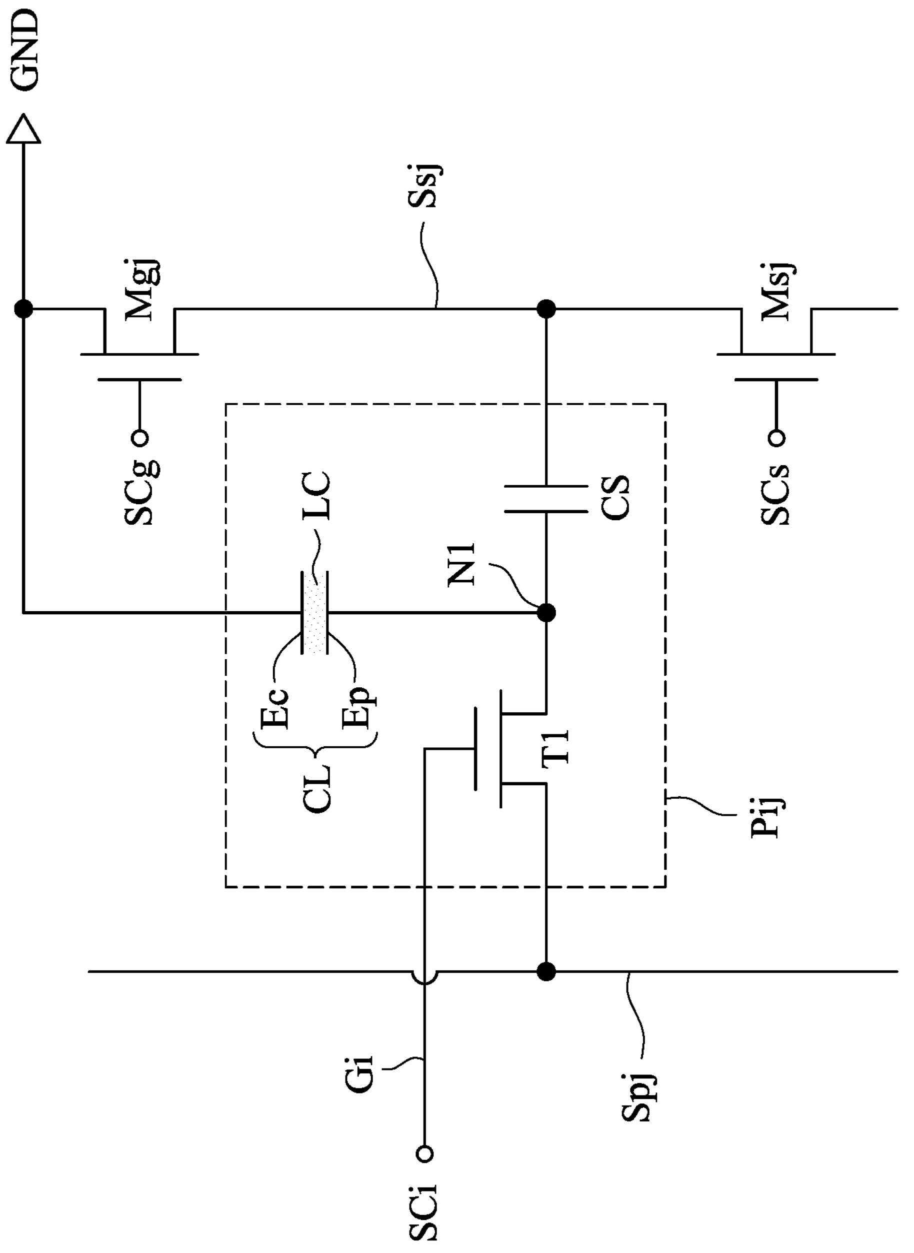
FIG. 5 depicts a schematic diagram of a phase shifter circuit according to some embodiments of the present disclosure.

A description is provided with reference to FIG. 4 and FIG. 5. FIG. 5 depicts a schematic diagram of a phase shifter circuit Pij according to some embodiments of the present disclosure. In some embodiments, each of the phase shifting circuits P11~Pnm in FIG. 4 can be implemented by the phase shifting circuit Pij in the embodiments of FIG. 5, in which "i" refers to a number in a range of 1~n, and "j" refers to a number in a range of 1~m. In some embodiments, the phase shifting circuit Pij refers to a phase shifting circuit in i-th row and j-th column. As shown in FIG. 5, the phase shifting circuit Pij is electrically connected to the gate line Gi, the source line Spj and the auxiliary source line Ssj. The auxiliary source line Ssj is electrically connected to the transistors Mgj and Msj, in which "i" and "j" are integers greater than or equal to 1. In some embodiments, each of the aforesaid transistors has a first end, a second end and a control end (gate). If a first end of a transistor is a drain end (/source end), a second end of the transistor is a source end (/drain end). And, each of the aforesaid capacitors has a first end and a second end. If a first end of a capacitor is anode (/cathode), a second end of the capacitor is cathode (/anode).

The phase shifting circuit Pij includes a storage capacitor CS, a phase shifting electrode Ep and a transistor T1. In structure, a first end of the transistor T1 is electrically connected to the source line Spj. A control end of the transistor T1 is electrically connected to the gate line Gi. The control end of the transistor T1 is configured to receive the control signal SCi transmitted by the gate line Gi.

Second ends of the transistor T1 is electrically connected to a first end of the storage capacitor CS and the phase shifting electrode Ep. In some embodiments, a node N1 is a connection between the second end of the transistor T1, the first end of the storage capacitor CS and the phase shifting electrode Ep. There are liquid crystals LC between the phase shifting electrode Ep and the common electrode Ec to form a liquid crystal capacitor CL, and the common electrode Ec is grounded. In some embodiments, the common electrode Ec corresponds to a portion of the common electrode 114 in the embodiments of FIG. 1B and FIG. 2, and the liquid crystals LC correspond to a portion of the liquid crystal layer 116 in the embodiments of FIG. 1B and FIG. 2.

A first end of the storage capacitor CS is electrically connected to a second end of the transistor T1. A second end of the storage capacitor CS is electrically connected to the auxiliary source line Ssj. The e auxiliary source line Ssj is electrically connected to the transistors Mgj and Msj.

A first end of the transistor Mgj is grounded. A control end of the transistor Mgj is configured to receive a control signal SCg. A second end of the transistor Mgj is electrically connected to the auxiliary source line Ssj. In some embodiments, the control signal SCg in FIG. 5 corresponds to the control signal SCg in FIG. 4.

A first end of the transistor Msj is electrically connected to the auxiliary source line Ssj. A control end of the transistor Msj receives the control signal SCs. A second end of the transistor Msj is electrically connected to the source driving circuit 430. In some embodiments, the control signal SCs in FIG. 5 corresponds to the control signal SCs in FIG. 4.

Figure 6:
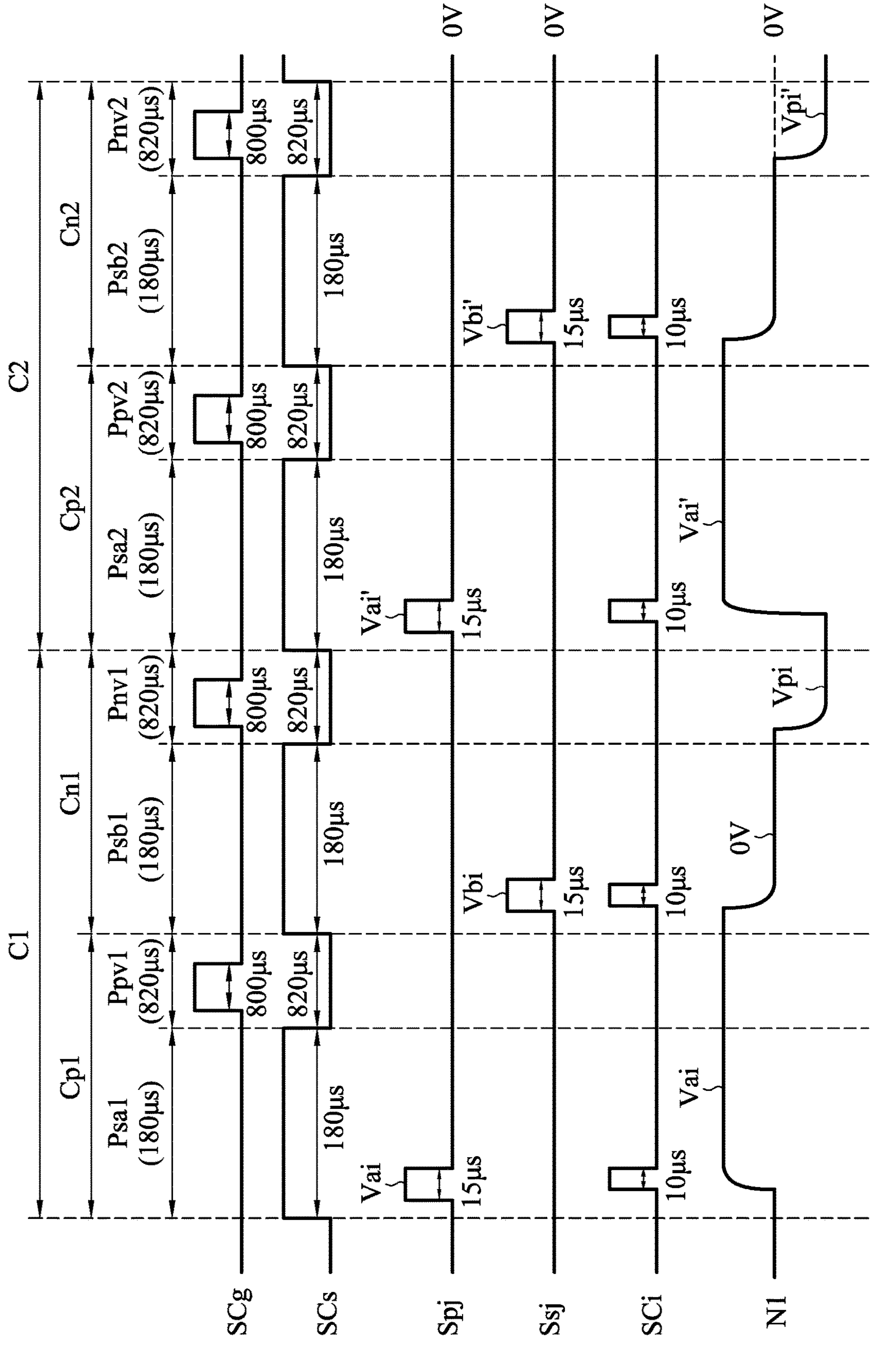
FIG. 6 depicts a timing diagram of signals and voltages at nodes of the phase shifter circuit in FIG. 5 according to some embodiments of the present disclosure.
Figure 7A:
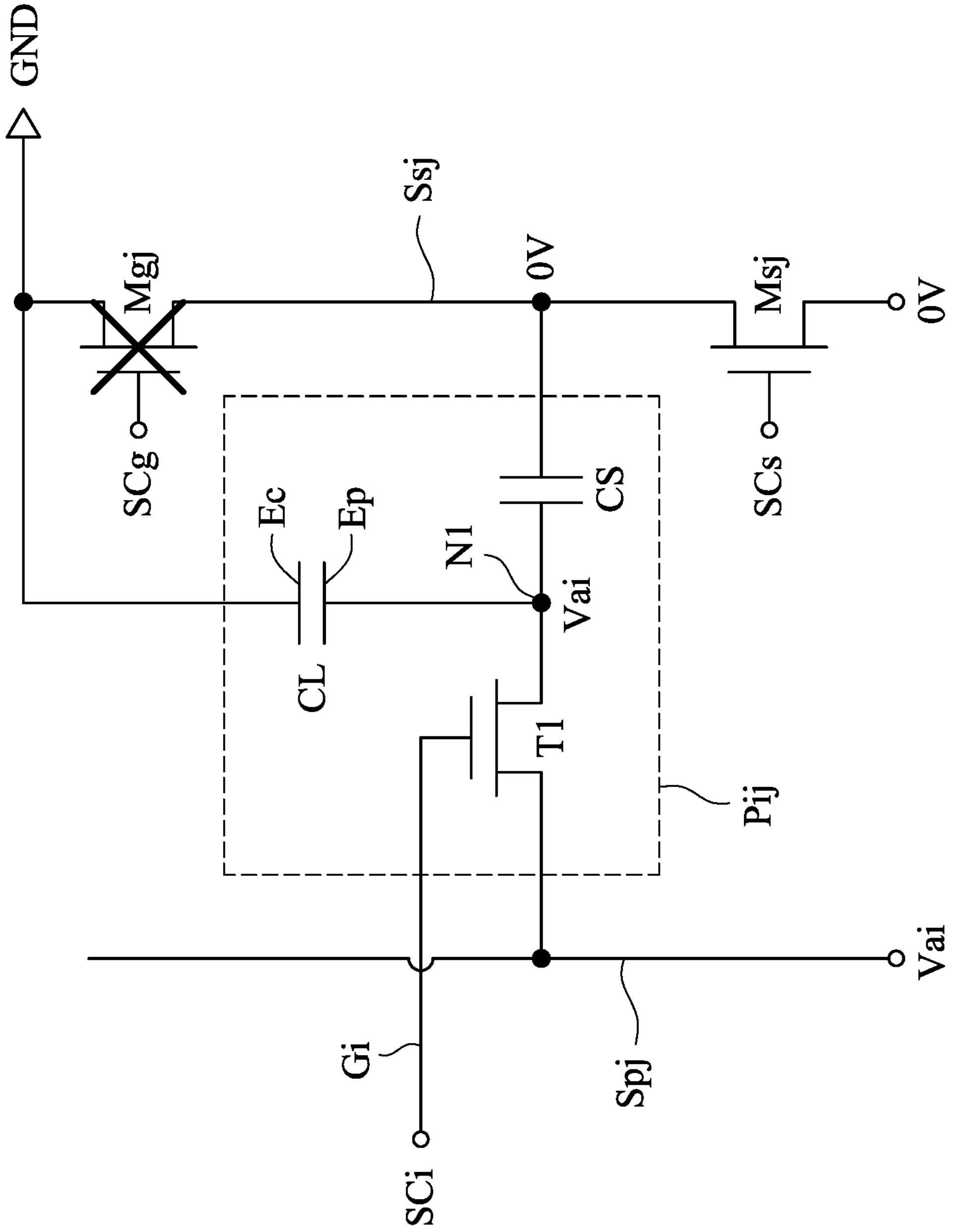
FIG. 7A and FIG. 7B depict operations of the phase shifter circuit in FIG. 5 during a setting period and positive voltage period of a positive half cycle according to some embodiments of the present disclosure.
Figure 7B:
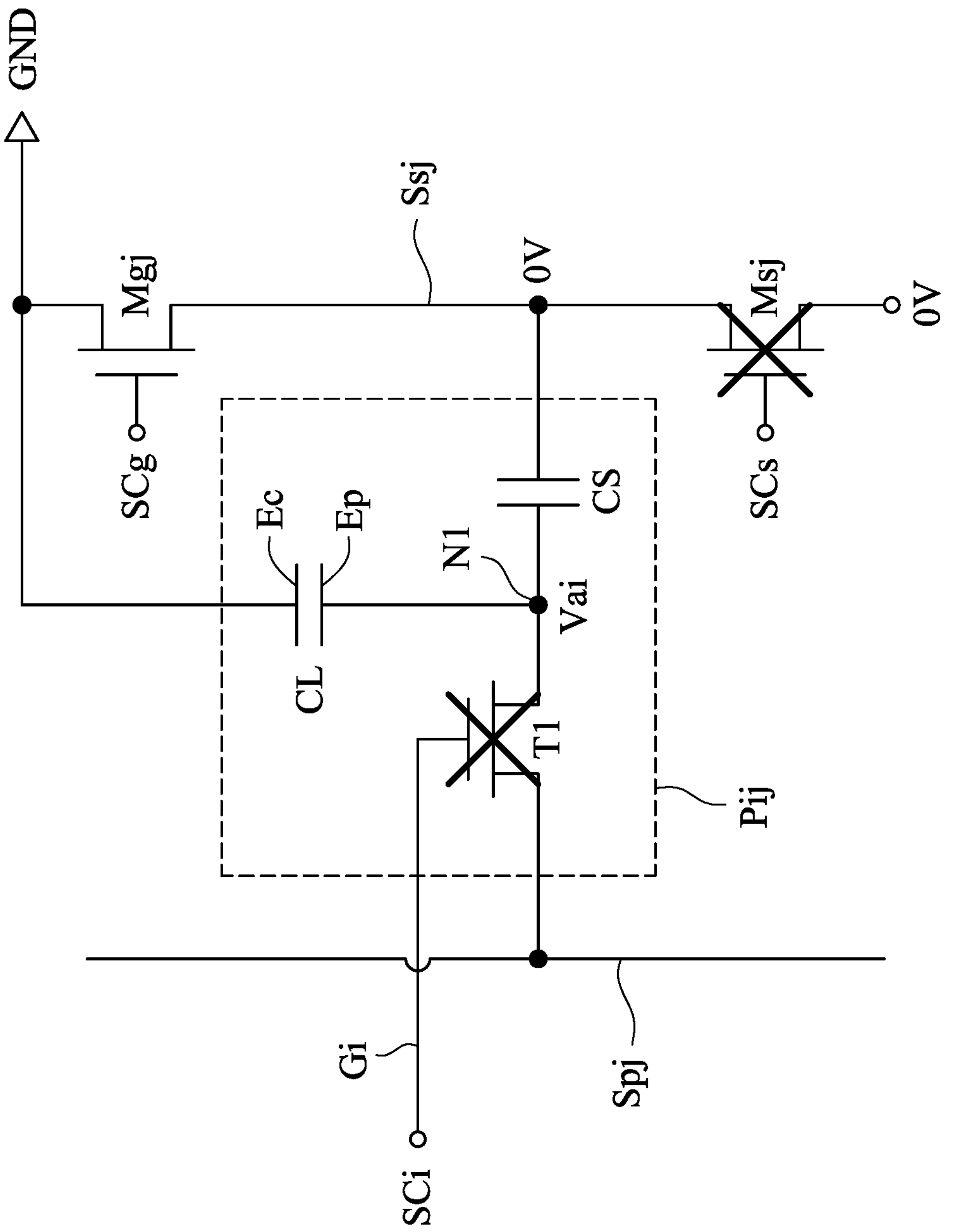
Figure 7C:
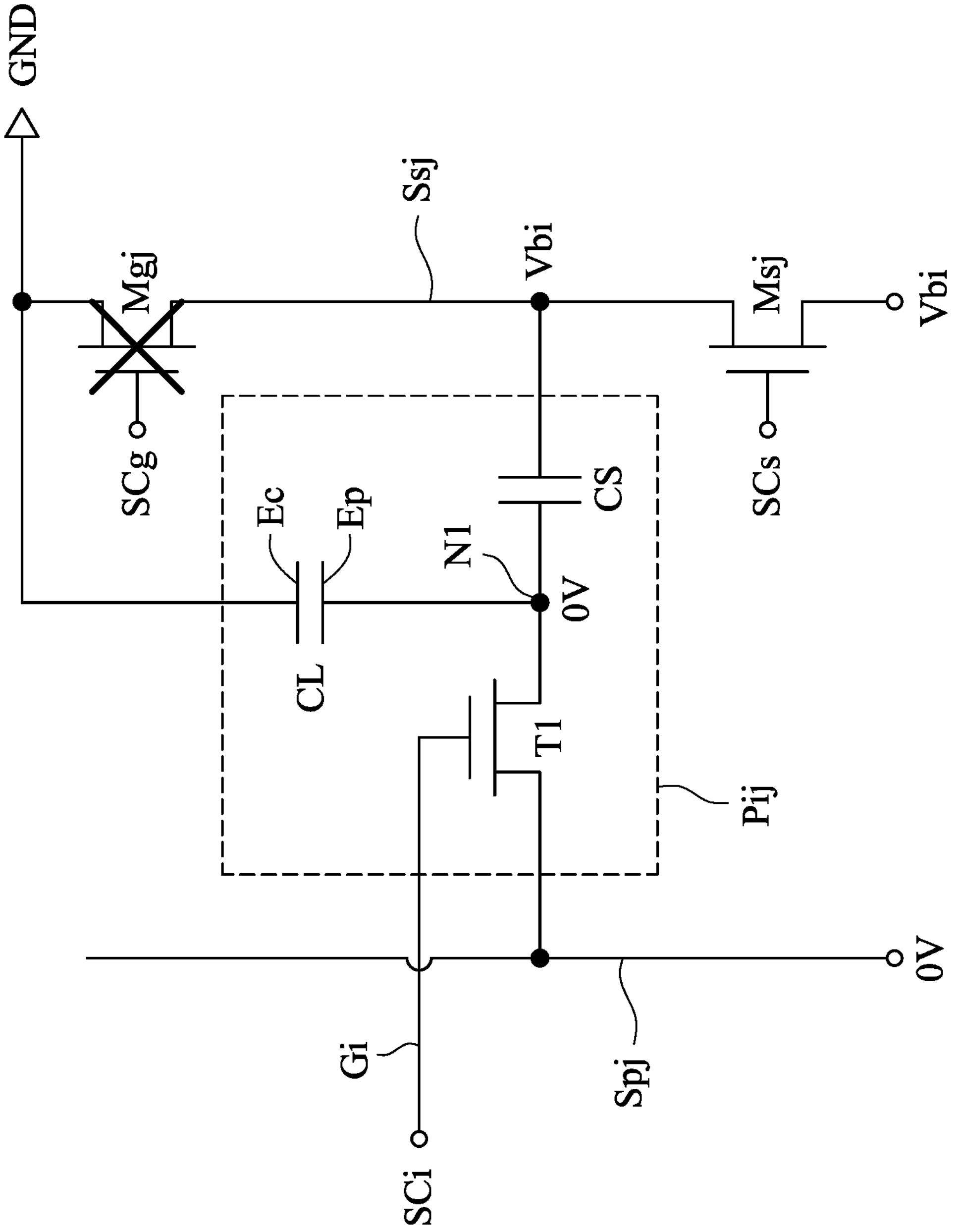
FIG. 7C and FIG. 7D depict operations of the phase shifter circuit in FIG. 5 during a setting period and negative voltage period of a negative half cycle according to some embodiments of the present disclosure.
Figure 7D:
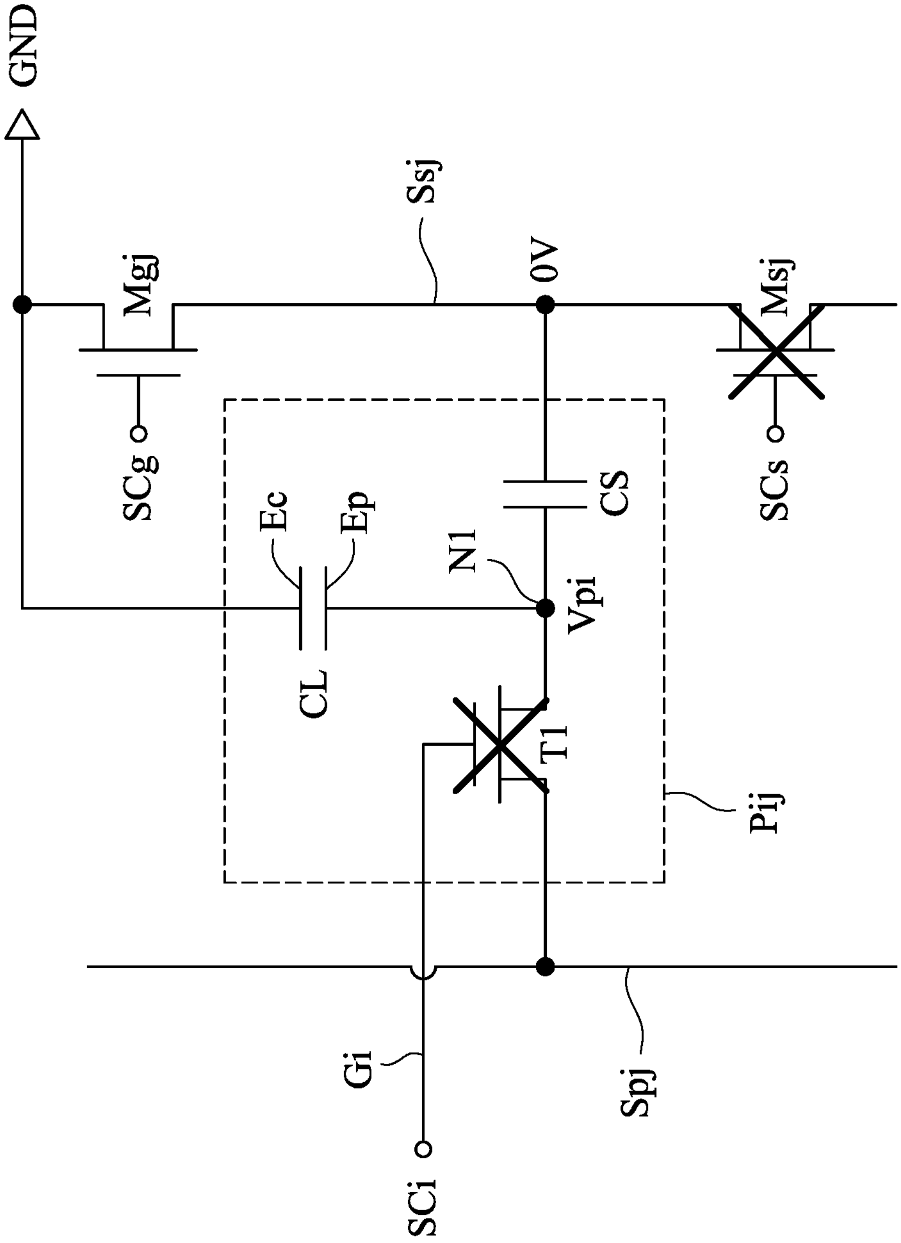

For better understanding, a description is provided with reference to FIG. 5 and FIG. 6 and FIGS. 7A-7D. FIG. 6 depicts a timing diagram of signals and voltages at nodes of the phase shifter circuit Pij in FIG. 5 according to some embodiments of the present disclosure. FIG. 7A and FIG. 7B depict operations of the phase shifter circuit Pij in FIG. 5 during a setting period and positive voltage period of a positive half cycle Cp1 according to some embodiments of the present disclosure. FIG. 7C and FIG. 7D depict operations of the phase shifter circuit Pij in FIG. 5 during a setting period and a negative voltage period of a negative half cycle Cn1 according to some embodiments of the present disclosure.

As shown in FIG. 6, a cycle of the control timing of the phase shifting circuit Pij can be divided into two half cycles which are a positive half cycle Cp1 and a negative half cycle Cn1. The positive half cycle Cp1 includes two periods which are a setting period Psa1 and a positive voltage period Ppv1. The negative half cycle Cn1 includes two periods which are a setting period Psb1 and a negative voltage period Pnv1. In some embodiments, the setting periods Psa1 and Psb1 can be considered as the data setting periods and/or scan periods. In some embodiments, the positive voltage period Ppv1 refers to a period that the voltage at the phase shifting electrode Ep is set at 0 volts or a positive voltage, the negative voltage period Pnv1 refers to a period that the voltage at the phase shifting electrode Ep is set at 0 volts or a negative voltage.

In some embodiments, the time length of each of the positive half cycle Cp1 and the negative half cycle Cn1 of the control timing of the phase shifting circuit Pij is 1 ms, in which the time length of each of the setting period Psa1 and the setting period Psb1 is 180 μs, and the time length of each of the positive voltage period Ppv1 and the negative voltage period Pnv1 is 820 μs. In some embodiments, the time length of each of the positive voltage period Ppv1 and the negative voltage period Pnv1 is longer than the time length of each of the setting periods Psa1 and Psb1. In the other embodiments, time lengths of the setting periods Psa1 and Psb1, the positive voltage period Ppv1 and the negative voltage period Pnv1 can be implemented by the appropriate time lengths; it is not intended to limit the present disclosure.

Specifically, the control signal SCg is at a low logic level in the setting period Psa1 of the positive half cycle Cp1 and the setting period Psb1 of the negative half cycle Cn1. The control signal SCg is at a high logic level in the positive voltage period Ppv1 of the positive half cycle Cp1 and the negative voltage period Pnv1 of the negative half cycle Cn1. The control signal SCs is at the high logic level in the setting period Psa1 of the positive half cycle Cp1 and the setting period Psb1 of the negative half cycle Cn1. The control signal SCs is at the low logic level in the positive voltage period Ppv1 of the positive half cycle Cp1 and the negative voltage period Pnv1 of the negative half cycle Cn1. In some embodiments, the control signal SCi can be considered as the scan signal.

In some embodiments, the voltages Vai and Vbi supplied by the source driving circuit 430 are larger than or equal to 0 volts. In some embodiments, the voltages Vai and Vbi supplied by the source driving circuit 430 are not less than 0 volts. In some embodiments, the voltages supplied by the source driving circuit 430 are 0 volts and/or positive voltages. In some embodiments, the voltages supplied by the source driving circuit 430 are not less than 0 volts. To be noted that, each pulse width (e.g., 15 μs) corresponding to the voltages Vai and Vbi supplied by the source driving circuit 430 is longer than each pulse width (e.g., 10 μs) of the control signal Sci, and each pulse corresponding to the voltages Vai and Vbi supplied by the source driving circuit 430 overlaps each pulse of the control signal Sci on the timeline.

As shown in FIG. 7A, in the setting period Psa1 of the positive half cycle Cp1, the transistor Msj is turned on according to the control signal SCs at a high logic level. On the other hand, the transistor Mgj is turned off according to the control signal SCg at a low logic level. In the setting period Psa1, the reference voltage supplied by the source driving circuit 430 is transmitted through the transistor Msj and auxiliary source line Ssj to the second end of the storage capacitor CS. During the second end of the storage capacitor CS being set at the reference voltage, the transistor T1 is turned on according to the control signal SCi, in order to transmit the voltage Vai supplied by the source driving circuit 430 through the source line Spj and the transistor T1 to the first end of the storage capacitor CS.

In some embodiments, the above said reference voltage can be implemented by 0 volts. In some embodiments, the above said reference voltage can be implemented by a voltage which is less than or equal to the voltage Vai, which is not intended to limit the present disclosure. In other words, when the reference voltage supplied by the source driving circuit 430 is transmitted to the second end of the storage capacitor CS, a voltage (that is, a voltage at node N1) at the first end of the storage capacitor CS is set at the voltage Vai, and the voltage Vai is greater than or equal to 0 volts. FIG. 6 illustrates an example that the voltage Vai is greater than 0 volts.

As shown in FIG. 7B, in the positive voltage period Ppv1 of the positive half cycle Cp1, the transistor Msj is turned off according to the control signal SCs at a low logic level. On the other hands, the transistor Mgj is turned on according to the control signal SCg at the high logic level. In the positive voltage period Ppv1, the transistor Mgj is turned on and the second end of the storage capacitor CS is grounded. At this time, since the transistor T1 turns off the path between the first end of the storage capacitor CS and the source line Spj, a voltage (that is, a voltage at node N1) at the first end of the storage capacitor CS is still maintained at the voltage Vai. Therefore, the voltage at the phase shifting electrode Ep is also voltage Vai, so as to control the alignment of the liquid crystals.

As shown in FIG. 7C, in the setting period Psb1 of the negative half cycle Cn1, the transistor Msj is turned on according to the control signal SCs at the high logic level. On the other hand, the transistor Mgj is turned off according to the control signal SCg at the low logic level. In the setting period Psb1, the voltage Vbi supplied by the source driving circuit 430 is transmitted through the transistor Msj and the auxiliary source line Ssj to the second end of the storage capacitor CS, and the voltage Vbi is greater than or equal to 0 volts. FIG. 6 illustrates an example that the voltage Vbi is greater than 0 volts. During the second end of the storage capacitor CS being set at the voltage Vbi, the transistor T1 is turned on according to the control signal SCi to transmit the reference voltage (e.g. a reference voltage of 0 volts) supplied by the source driving circuit 430 through the source line Spj and the transistor T1 to a first end of the storage capacitor CS. In other words, when the voltage Vbi supplied by the source driving circuit 430 is transmitted to the second end of the e storage capacitor CS, a voltage (that is, a voltage at the node N1) at the first end of the storage capacitor CS is set at 0 volts, such that the voltage at the first end of the storage capacitor CS is less than or equal to the voltage at the second end of the storage capacitor CS.

As shown in FIG. 7D, in the negative voltage period Pnv1 of the negative half cycle Cn1, the transistor Msj is turned off according to the control signal SCs at the low logic level. On the other hand, the transistor Mgj is turned on according to the control signal SCg at the high logic level. In the negative voltage period Pnv1, the transistor Mgj is turned on and the second end of the storage capacitor CS is grounded. Since the transistor T1 turns off a path between the first end of the storage capacitor CS and the source line Spj, a voltage variation at the second end of the storage capacitor CS variated from the voltage Vbi to a ground voltage is transferred to the first end of the storage capacitor CS by capacitive coupling effect. At this time, a voltage (that is, the voltage at node N1) at the first end of the storage capacitor CS can be expressed by the voltage Vpi in the following formula.

$$Vpi = (0 - Vbi) \times \frac{C_s}{(C_s + C_L)}$$

In the above formula, a capacitance of the storage capacitor CS is expressed by CS, and a capacitance of the liquid crystal capacitor CL is expressed by the CL. As such, in the negative voltage period Pnv1, the voltage at the phase shifting electrode Ep is equal to the voltage Vpi which is less than or equal to 0 volts (the voltage Vpi illustrated in the embodiment of FIG. 6 is less than 0 volts), so as to control the alignment of the liquid crystals. As a result, the operation at the negative half cycle can be provided on a basis of the voltages supplied by the source driving circuit 430 greater than and/or less than 0 volts, in order to avoid the deformation inertia of the liquid crystal.

And then, the nest cycle C2 includes a positive half cycle Cp2 and a negative half cycle Cn2. The positive half cycle Cp2 includes two periods which are a setting period Psa2 and a positive voltage period Ppv2. The negative half cycle Cn2 includes two periods which are a setting period Psb2 and a negative voltage period Pnv2.

In the setting period Psa2 of the positive half cycle Cp2, the source driving circuit 430 transmits the voltage Vai' through the source line Spi to the node N1, and a voltage at the node N1 is set at the voltage Vai' which remains to the positive voltage period Ppv2 of the positive half cycle Cp2. In the setting period Psb2 of the negative half cycle Cn2, since the source driving circuit 430 transmits the reference voltage (e.g. 0 volts) through the source line Spi to the node N1, and the source driving circuit 430 transmits the voltage Vbi' through the auxiliary source line Spi to the second end of the storage capacitor CS.

In the negative voltage period Pnv2 of the negative half cycle Cn2, the second end of the storage capacitor CS is grounded, and a voltage variation (e.g. (0-Vbi') volts) at the second end of the storage capacitor CS variated from the voltage Vbi' to the ground voltage is transferred to the first end of the storage capacitor CS by the capacitive coupling effect. At this time, a voltage (that is, a voltage at the node N1) at the first end of the storage capacitor CS can be expressed by the voltage Vpi' in the following formula.

$$Vpi' = (0 - Vbi') \times \frac{C_s}{(C_s + C_L)}$$

As such, in the negative voltage period Pnv2, a voltage at the phase shifting electrode Ep is equal to the voltage Vpi' which is less than or equal to 0 volts (the voltage Vpi' illustrated in the embodiment of FIG. 6 is less than 0 volts), so as to control the alignment of the liquid crystals. As a result, the operation at the negative half cycle can be provided on a basis of the voltages supplied by the source driving circuit 430 greater than and/or less than 0 volts, in order to avoid the deformation inertia of the liquid crystal. In other words, the voltages supplied by the source driving circuit 430 are not less than 0 volts.

The detail operation of the phase shifting circuit Pij in cycle C2 is similar to the operation of the phase shifting circuit Pij in cycle C1, and the description is omitted here.

Figure 8:
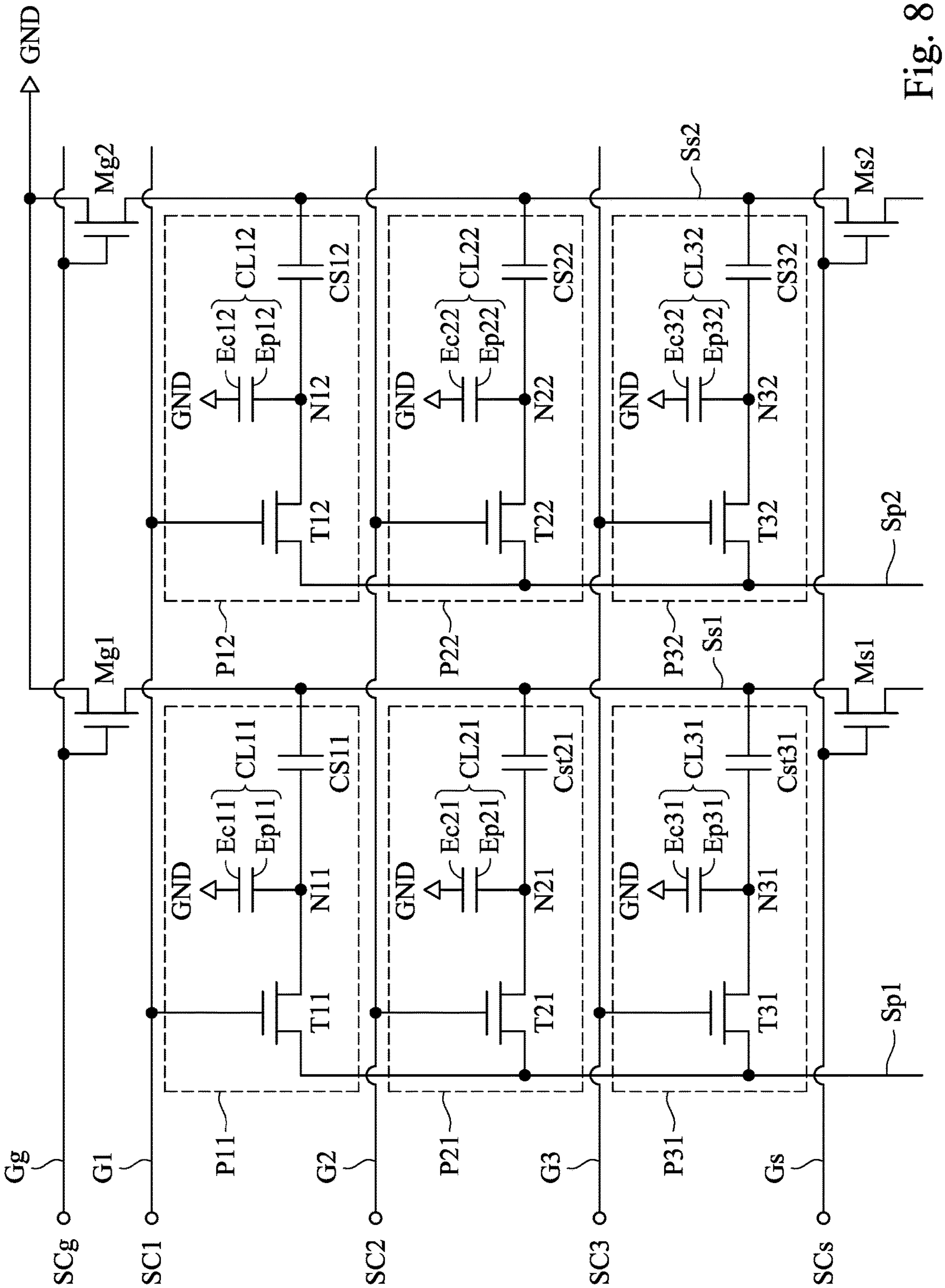
FIG. 8 depicts a schematic diagram of a phased array according to some embodiments of the present disclosure.

A description is provided with reference to FIG. 8. FIG. 8 depicts a schematic diagram of a phased array 118 according to some embodiments of the present disclosure. In some embodiments, the phased array 118 includes phase shifting circuits P11~P31 and P12~P32 which correspond to the phase shifting circuits P11~Pn2 in FIG. 4. As shown in FIG. 8, the phase shifting circuits P11~P31 are respectively arranged in the first to third rows of the matrix. The phase shifting circuits P11~P31 includes transistors T11~T31, storage capacitors CS11~CS31 and phase shifting electrodes EP11~EP31.

Specifically, first ends of the transistors T11~T31 are electrically connected to the source line Sp1. Control ends of the transistors T11~T31 are electrically connected to the gate lines G1~G3, and the control ends of the transistors T11~T31 receive the control signals SC1~SC3 through the gate lines G1~G3, respectively. Second ends of the transistors T11~T31 are respectively electrically connected to the first ends of the storage capacitors CS11~CS31 and the phase shifting electrodes Ep11~Ep31. The phase shifting electrodes Ep11~Ep13 and the common electrodes Ec11~Ec31 form the liquid crystal capacitors CL11~CL13. In some embodiments, the common electrode Ec11~Ec31 correspond to a portion of the common electrode 114 in FIGS. 1 B and 2.

Similarity, the phase shifting circuits P12~P32 are respectively arranged in the first to third rows of the matrix. The phase shifting circuits P12~P32 include transistors T12~T32, storage capacitors CS12~CS32 and phase shifting electrodes EP12~EP32. Specifically, first ends of the transistors T12~T32 are electrically connected to the source line Sp2. Control ends of the transistors T12~T32 are electrically connected to the gate lines G1~G3, and the control ends of the transistors T12~T32 receive the control signals SC1~SC3 through the gate lines G1~G3.

Second ends of the transistors T12~T32 are respectively connected to the first ends of the storage capacitors CS12~CS32 and the phase shifting electrodes Ep12~Ep32. In some embodiments, the nodes N12~N32 are the connections between the phase shifting electrodes Ep12~Ep32 and the corresponding storage capacitors CS12~CS32, respectively. The phase shifting electrodes Ep12~Ep32 and the common electrodes Ec12~Ec32 form the liquid crystal capacitors CL12~CL32. In some embodiments, the common electrodes Ec12~Ec32 respectively correspond to the portions of the common electrode 114 in FIG. 1B and FIG. 2. The connection relationship of the elements included in the phase shifting circuits P12~P32 is similar to the connection relationship of the elements included in the phase shifting circuits P11~P31, and the description is omitted here.

Figure 9:
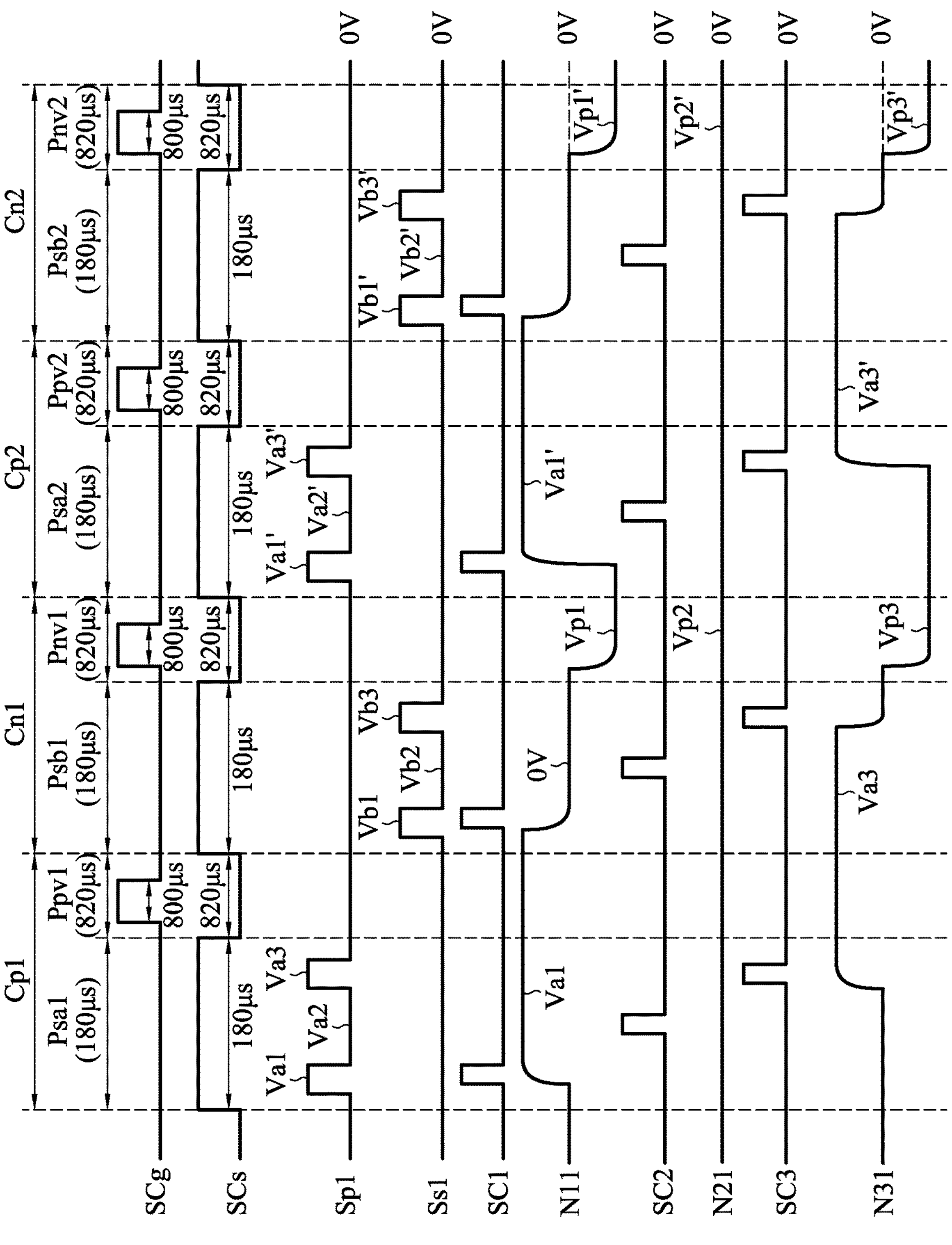
FIG. 9 depicts a timing diagram of signals and voltages at nodes of phase shifting circuits included in the phased array in FIG. 8 according to some embodiments of the present disclosure.

A description is provided with reference to FIG. 4, FIG. 8 and FIG. 9. FIG. 9 depicts a timing diagram of signals and voltages at nodes of phase shifting circuits P11~P31 included in the phased array 118 in FIG. 8 according to some embodiments of the present disclosure. As shown in FIG. 9, a cycle of a control timing of the phased array 118 can be divided into two half cycles which are a positive half cycle Cp1 and a negative half cycle Cn1. The positive half cycle Cp1 includes two periods which are a setting period Psa1 and a positive voltage period Ppv1. The negative half cycle Cn1 includes two periods which are a setting period Psb1 and a negative voltage period Pnv1.

In the setting period Psa1 of the positive half cycle Cp1, the transistor T11~T31 are turned on in sequence according to the control signals SC1~SC3, in order to transmit the voltages Va1~Va3 through the source line Sp1 to the first ends of the storage capacitors CS11~CS31 in sequence. At this time, the transistor Mg1 is turned off according to the control signal SCg, and the transistor Ms1 is turned on according to the control signal SCs, so as to transmit the voltage (e.g. 0 volts) supplied by the source driving circuit 430 to the second ends of the storage capacitors CS11~CS31.

In the positive voltage period Ppv1 of the positive half cycle Cp1, the transistors T11~T31 are turned off according to the control signals SC1~SC3. At this time, the transistor Ms1 is turned off according to the control signal SCs, and the transistor Mg1 is turned on according to the control signal SCg, such that the second ends of the storage capacitors CS11~CS31 are grounded. As such, the phase shifting circuit P11~P31 respectively control the alignment of the liquid crystals according to the voltages Va1~Va3 at the phase shifting electrodes Ep11~Ep31, in order to control the direction and the wave field of the high frequency signal.

In the setting period Psb1 of the negative half cycle Cn1, the transistor T11~T31 are turned on in sequence according to the control signals SC1~SC3, so as to transmit the reference voltage (e.g. 0 volts) through the source line Sp1 to the first ends of the storage capacitor CS11~CS31 in sequence. At this time, the transistor Mg1 is turned off according to the control signal SCg, and the transistor Ms1 is turned on according to the control signal SCs, in order to transmit the voltages Vb1~Vb3 supplied from the source driving circuit 430 through the source line Ss1 to the second ends of the storage capacitors CS11~CS31, such that the voltage differences between two ends of each of the storage capacitors CS11~CS31 are set at (0-Vb1) volts, (0-Vb2) volts and (0-Vb3) volts.

In the negative voltage period Pnv1 of the negative half cycle Cn1, the transistors T11~T31 are turned off according to the control signals SC1~SC3. At this time, the transistor Ms1 is turned off according to the control signal SCs, and the transistor Mg1 is turned on according to the control signal SCg, such that the second ends of the storage capacitors CS11~CS31 are grounded. The voltage variations of the second ends of the storage capacitor CS11~CS31 variated from the voltages Vb1~Vb3 to the ground voltage are (0-Vb1) volts, (0-Vb2) volts and (0-Vb3) volts are transferred to the first ends of the storage capacitor CS11~CS31. At this time, the voltages Vp1~Vp3 at the first ends of the storage capacitor CS11~CS31 (which correspond to the node N11~N31) can be expressed by the following formula.

$$Vp1 = (0 - Vb1) \times \frac{C_s}{(C_s + C_L)}$$

$$Vp2 = (0 - Vb2) \times \frac{C_s}{(C_s + C_L)}$$

$$Vp3 = (0 - Vb3) \times \frac{C_s}{(C_s + C_L)}$$

In the above formula, the value of the voltage Vb2 (e.g. 0 volts) is for an example, and the voltage Vp2 is equal to 0 volts in this case. As such, in the negative voltage period Pnv1, the voltages at the phase shifting electrodes Ep11~EP31 are voltages Vp1~Vp3 which less than or equal to 0 volts, in order to control the alignment of the liquid crystal based on the voltages Vp1~Vp3, such that operation in the negative half cycle is provided. In some embodiments, the voltages Vb1~Vb3 supplied by the source driving circuit 430 are in the negative half cycle Cn1 are greater than or equal to 0 volts (FIG. 9 illustrates an example that the voltages Vb1 and Vb3 is greater than 0 volts and the voltage Vb2 is equal to 0 volts), such that the output range of the source driving circuit 430 does not need to include the negative voltage range.

As such, the voltages at the phase shifting electrode Ep11~Ep31 are set at positive voltages and/or the ground voltage in the positive voltage period Ppv1, and the voltages at the phase shifting electrode Ep11~Ep31 are set at negative voltages and/or the ground voltage in the negative voltage period Pnv1 by the capacitive coupling effect, so as to avoid the deformation inertia of the liquid crystal.

In the positive half cycle Cp2 of the next cycle, the source driving circuit 430 sets the voltages Va1'~Va3' to the first ends of the storage capacitors CS11~CS31 in sequence, and the first ends of the storage capacitors CS11~CS31 are maintained at the voltages Val'~Va3'.

In the setting period Psb2 of the negative half cycle Cn2, the source driving circuit 430 set the voltages Vb1'~ Vb3' to the second ends of the storage capacitors CS11~CS31, and the voltage variations at the second ends of the storage capacitors CS11~CS31 are transferred to the first ends of the storage capacitors CS11~CS31 in the negative voltage period Pnv2, such the voltage Vp1'~ Vp3' at the first ends of the storage capacitor CS11~CS31 are equal to and/or less than 0 volts (FIG. 9 illustrates an example that the voltages Vp1' and Vp3' are less than 0 volts and the voltage Vp2 is equal to 0 volts).

The operations in the setting period Psa2 and the positive voltage period Ppv2 of the positive half cycle Cp2 and the setting period Psb2 and the negative voltage period Pnv2 of the negative half cycle Cn2 are similar to the operations in the setting period Psa2 and the positive voltage period Ppv2 of the positive half cycle Cp1 and the setting period Psb2 and the negative voltage period Pnv2 of the negative half cycle Cn1, and the description is omitted here. The operations of phase shifting circuits P12~P32 in the second column of the phased array 118 in FIG. 8 are similar to the operations of phase shifting circuits P11~P31 in the first column of the phased array 118 in FIG. 8, and the description is omitted here.

Figure 10:
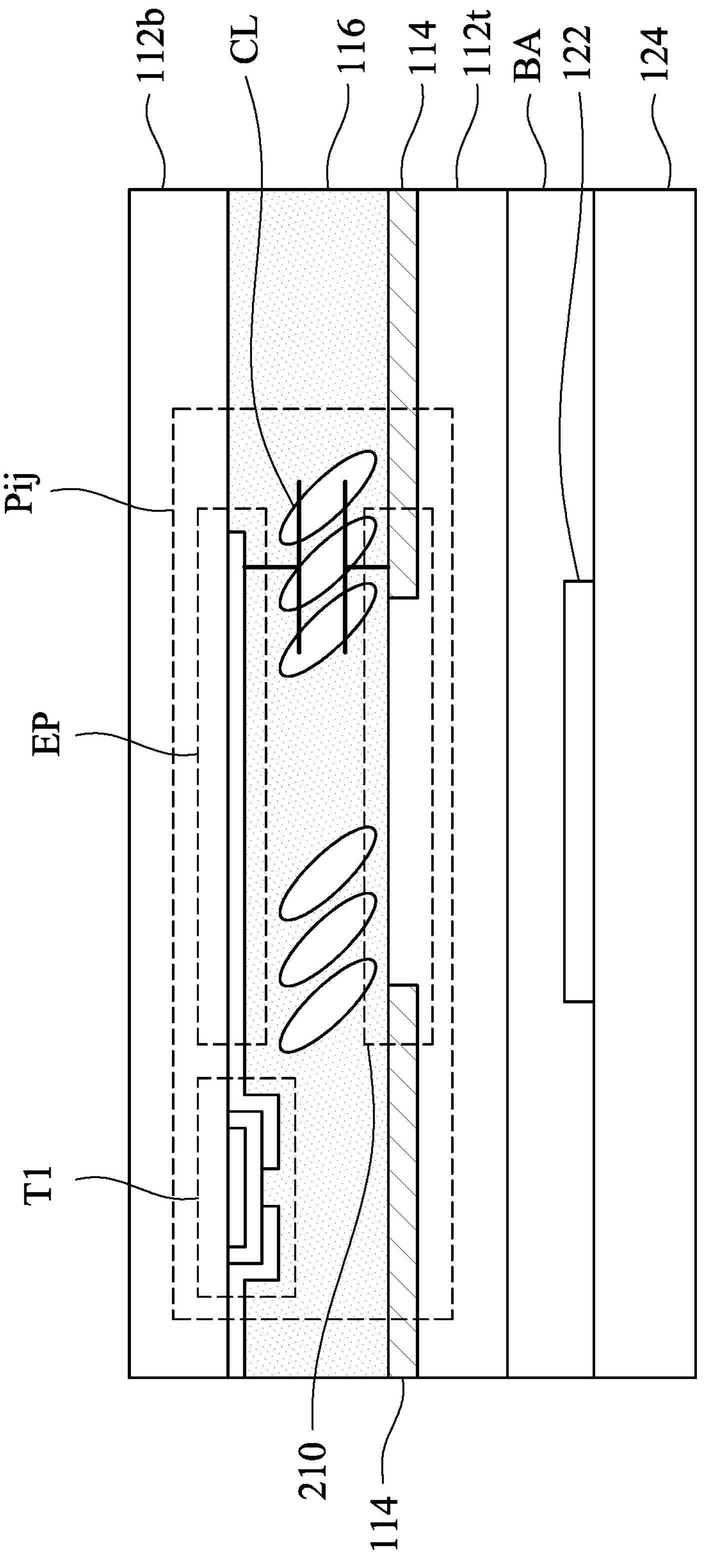
FIG. 10 depicts a cross section of a portion of the antenna device in FIG. 1A according to some embodiments of the present disclosure.

A description is provided with reference to FIG. 1A-1B, FIG. 5 and FIG. 10. FIG. 10 depicts a cross section of a portion of the antenna device 100 in FIG. 1A according to some embodiments of the present disclosure. As shown in FIG. 10, the transistor T1 is formed on the substrate 112*b* and faces to the liquid crystal layer 116. The common electrode 114 is formed on the substrate 112*t* and faces to the liquid crystal layer 116. There is a liquid crystal layer 116 between the substrate 112*b* and the substrate 112*t*. A first end of the transistor T1 is electrically connected to the liquid crystal capacitor CL formed by the phase shifting electrode EP and a portion of the common electrode 114.

In some embodiments, the common electrode 114 is formed on the first surface of the substrate 112*t*, and a first surface of the feeding plate 120 is attached to a second surface of the substrate 112*t* by the bonding adhesive BA. In some embodiments, the microstrip feed line 122 is formed on the first surface of the feeding plate 120. As such, the microstrip feed line 122 and the common electrode 114 form the microstrip antenna.

Summary, the liquid crystal phase shifter 110 and the feeding plate 120 of the antenna device 100 can reduce the cost of the traditional array antennas produced by the printed circuit board fabrication process and to reduce the use of high frequency printed circuit boards. The microstrip antenna is formed by the common electrode 114 of the liquid crystal phase shifter 110 and the microstrip feed line 122 of the feeding plate 120, such that the volume and cost of the manufacturing process can be reduced. Furthermore, the circuit structure and the configuration control signals of the antenna device 100 of the present disclosure can provide the operations in positive half cycle and negative half cycle without changing the output range of the source driving circuit 430, in order to avoid the deformation inertia of the liquid crystal.

Although specific embodiments of the disclosure have been disclosed with reference to the above embodiments, these embodiments are not intended to limit the disclosure. Various alterations and modifications may be performed on the disclosure by those of ordinary skills in the art without departing from the principle and spirit of the disclosure. Thus, the protective scope of the disclosure shall be defined by the appended claims.

What is claimed is:

1. A liquid crystal phase shifter, comprising:
- a first transistor, with a first end electrically connected to a source line, with a control end configured to receive a first control signal;
- a storage capacitor, with a first end electrically connected to a second end of the first transistor, with a second end electrically connected to an auxiliary source line;
- a phase shifting electrode, electrically connected to the second end of the first transistor;
- a common electrode, configured to receive a ground voltage, wherein the common electrode and the phase shifting electrode form a liquid crystal capacitor, wherein the liquid crystal phase shifter is attached to a feeding plate, and wherein the common electrode of the liquid crystal phase shifter and a microstrip feed line of the feeding plate form a microstrip antenna; and
- a second transistor, with a first end configured to receive the ground voltage, with a second end electrically connected to the auxiliary source line.

2. The liquid crystal phase shifter of claim 1, further comprising:
- the second transistor, with a control end configured to receive a second control signal;
- a source driving circuit; and
- a third transistor, with a first end electrically connected to the auxiliary source line, with a second end electrically connected to the source driving circuit, with a control end configured to receive a third control signal.

3. The liquid crystal phase shifter of claim 2, wherein when in a first setting period of a positive half cycle, the third transistor is turned on according to the third control signal to transmit a reference voltage supplied from the source driving circuit through the third transistor and the auxiliary source line to the second end of the storage capacitor, and wherein during the second end of the storage capacitor being set at the reference voltage, the first transistor is turned on according to the first control signal to transmit a first voltage supplied from the source driving circuit through the source line and the first transistor to the first end of the storage capacitor.

4. The liquid crystal phase shifter of claim 3, wherein the first voltage supplied from the source driving circuit is greater than or equal to the reference voltage, and wherein the reference voltage is 0 volts.

5. The liquid crystal phase shifter of claim 2, wherein when in a second setting period of a negative half cycle, the third transistor is turned on according to the third control signal to transmit a second voltage supplied from the source driving circuit through the third transistor and the auxiliary source line to the second end of the storage capacitor, and wherein during the second end of the storage capacitor being set at the second voltage, the first transistor is turned on according to the first control signal to transmit a reference voltage supplied from the source driving circuit through the source line and the first transistor to the first end of the storage capacitor.

6. The liquid crystal phase shifter of claim 5, wherein the second voltage supplied from the source driving circuit is greater than or equal to the reference voltage, and wherein the reference voltage is 0 volts.

7. The liquid crystal phase shifter of claim 5, wherein when in a positive voltage period of a positive half cycle and a negative voltage period of the negative half cycle, the first transistor and the third transistor are turned off according to the first control signal and the third control signal, respectively, and the second transistor is turned on according to the second control signal to transmit the ground voltage to the second end of the storage capacitor, and wherein in the negative voltage period of the negative half cycle, a voltage variation at the second end of the storage capacitor variated from the second voltage to the ground voltage is transferred to the first end of the storage capacitor by capacitive coupling effect.

8. A liquid crystal phase shifter, comprising:

a phased array, comprising:

a plurality of first phase shifting circuits, arranged in a plurality of rows of a matrix, wherein the first phase shifting circuits comprise a plurality of first transistors, a plurality of first storage capacitors and a plurality of phase shifting electrodes electrically connected to first ends of the first storage capacitors; and a first source line, electrically connected to first ends of the first transistors, wherein second ends of the first transistors are electrically connected to the first ends of the first storage capacitors, respectively;

a first auxiliary source line, electrically connected to second ends of the first storage capacitors;

a common electrode, wherein the common electrode and the first phase shifting electrodes form a plurality of first liquid crystal capacitors, and wherein the common electrode is configured to receive a ground voltage; and a plurality of second phase shifting circuits, arranged in the rows of the matrix, wherein the second phase shifting circuits comprise a plurality of second transistors, a plurality of second storage capacitors and a plurality of second phase shifting electrodes electrically connected to first ends of the second storage capacitors, wherein the common electrode and the second phase shifting electrodes form a plurality of second liquid crystal capacitors, and wherein control ends of the second transistors are configured to receive a plurality of first control signals, respectively.

9. The liquid crystal phase shifter of claim 8, wherein the common electrode of the liquid crystal phase shifter and a microstrip feed line of a feeding plate form a microstrip antenna.

10. The liquid crystal phase shifter of claim 8, further comprising:

a source driving circuit, electrically connected to the first phase shifting circuits, and wherein an output range of the source driving circuit does not include negative voltage range.

11. The liquid crystal phase shifter of claim 8, wherein control ends of the first transistors are configured to receive the plurality of first control signals, respectively, and wherein the phased array further comprises:

a second source line, electrically connected to first ends of the second transistors; and a second auxiliary source line, electrically connected to second ends of the second storage capacitors, and wherein the source driving circuit is electrically connected to the second source line and the second auxiliary source line.

12. An antenna device, comprising:

a feeding plate, comprising:

a circuit board;

a microstrip feed line; and a ground layer, wherein the ground layer and the microstrip feed line are disposed in opposite surfaces of the circuit board; and a liquid crystal phase shifter, attached to the feeding plate, wherein the liquid crystal phase shifter overlaps a portion of the microstrip feed line, and wherein the liquid crystal phase shifter comprises:

a first substrate;

a phased array, formed on the first substrate;

a liquid crystal layer;

a second substrate; and a common electrode, formed on the second substrate, wherein the liquid crystal layer is disposed between the phased array and the common electrode, wherein the common electrode is electrically connected to the ground layer, and wherein the common electrode of the liquid crystal phase shifter and the microstrip feed line of the feeding plate form a microstrip antenna.

13. The antenna device of claim 12, wherein the phased array comprises a plurality of phase shifting circuits arranged in a matrix, and wherein each of the phase shifting circuits comprises:

a first transistor, with a first end electrically connected to a source line, with a control end configured to receive a first control signal;

a storage capacitor, with a first end electrically connected to a second end of the first transistor, with a second end electrically connected to an auxiliary source line; and a phase shifting electrode, electrically connected to the second end of the first transistor, and wherein the phase shifting electrode and a portion of the common electrode form a liquid crystal capacitor.

14. The antenna device of claim 13, wherein the phased array further comprises:

a second transistor, with a first end configured to receive a ground voltage, with a second end electrically connected to the auxiliary source line, with a control end configured to receive a second control signal;

a source driving circuit; and a third transistor, with a first end electrically connected to the auxiliary source line, with a second end electrically connected to the source driving circuit, with a control end configured to receive a third control signal.

15. The antenna device of claim 14, wherein when in a first setting period of a positive half cycle, the third transistor is turned on according to the third control signal to transmit a reference voltage supplied from the source driving circuit through the third transistor and the auxiliary source line to the second end of the storage capacitor, and wherein during the second end of the storage capacitor being set at the reference voltage, the first transistor is turned on according to the first control signal to transmit a first voltage supplied from the source driving circuit through the source line and the first transistor to the first end of the storage capacitor.

16. The antenna device of claim 14, wherein when in a second setting period of a negative half cycle, the third transistor is turned on according to the third control signal to transmit a second voltage supplied from the source driving circuit through the third transistor and the auxiliary source line to the second end of the storage capacitor, and wherein during the second end of the storage capacitor being set at the second voltage, the first transistor is turned on according to the first control signal to transmit a reference voltage supplied from the source driving circuit through the source line and the first transistor to the first end of the storage capacitor.

17. The antenna device of claim 16, wherein the second voltage supplied from the source driving circuit is greater than or equal to the reference voltage, and wherein the reference voltage is 0 volts.

18. The antenna device of claim 16, wherein when in a positive voltage period of a positive half cycle and a negative voltage period of the negative half cycle, the first transistor and the third transistor are turned off according to the first control signal and the third control signal, respectively, and the second transistor is turned on according to the second control signal to transmit the ground voltage to the second end of the storage capacitor, and wherein in the negative voltage period of the negative half cycle, a voltage variation at the second end of the storage capacitor variated from the second voltage to the ground voltage is transferred to the first end of the storage capacitor by capacitive coupling effect.

19. The antenna device of claim 12, wherein the phased array comprises a plurality of phase shifting circuits, and wherein the liquid crystal phase shifter comprises:

a source driving circuit, electrically connected to the phase shifting circuits, and wherein an output range of the source driving circuit does not include negative voltage range.

20. The antenna device of claim 19, wherein the source driving circuit supplies voltages to the phase shifting circuits, and wherein each of the voltages is not less than 0 volts.

* * * * *